United States Patent
Kawashima et al.

(10) Patent No.: US 7,683,687 B2
(45) Date of Patent: Mar. 23, 2010

(54) HYSTERESIS CHARACTERISTIC INPUT CIRCUIT INCLUDING RESISTORS CAPABLE OF SUPPRESSING PENETRATION CURRENT

(75) Inventors: Shinji Kawashima, Shiga (JP); Kazunori Doi, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 29 days.

(21) Appl. No.: 11/979,697

(22) Filed: Nov. 7, 2007

(65) Prior Publication Data
US 2008/0204101 A1 Aug. 28, 2008

(30) Foreign Application Priority Data
Feb. 28, 2007 (JP) .............................. 2007-048445

(51) Int. Cl.
*H03K 3/00* (2006.01)
(52) U.S. Cl. .................. 327/206; 327/205; 327/112
(58) Field of Classification Search ......... 327/205–206, 327/112; 326/83
See application file for complete search history.

(56) References Cited

U.S. PATENT DOCUMENTS

| 4,563,594 A | * | 1/1986 | Koyama | 327/206 |
| 5,175,445 A | * | 12/1992 | Kinugasa et al. | 327/206 |
| 6,140,835 A | * | 10/2000 | Shirai | 327/206 |

FOREIGN PATENT DOCUMENTS

| JP | 5-327461 | 12/1993 |
| JP | 10-154924 | 6/1998 |

* cited by examiner

*Primary Examiner*—Long Nguyen
(74) *Attorney, Agent, or Firm*—McGinn IP Law Group PLLC (57) ABSTRACT

In a hysteresis characteristic input circuit, first and second resistors are connected in parallel between a first power supply terminal and a connection point, and first and second MOS transistors are connected in parallel between the connection point and a second power supply terminal and are controlled by an input voltage. An inverter has an input connected to the connection point and an output adapted to generate an output voltage. A first switching element is connected in series to the second resistor, and a second switching element is connected in series to the second MOS transistor. The first and second switching elements are complementarily controlled by the output voltage.

13 Claims, 8 Drawing Sheets

HYSTERESIS CHARACTERISTIC INPUT CIRCUIT INCLUDING RESISTORS CAPABLE OF SUPPRESSING PENETRATION CURRENT

BACKGROUND OF THE INVENTION

1. Field of the Invention

The present invention relates to a CMOS type hysteresis characteristic input circuit used in a DC stabilized power supply apparatus.

2. Description of the Related Art

Generally, a DC stabilized power supply apparatus is incorporated into an electronic apparatus. Recently, in order to suppress the power consumption in an OFF operation for the DC stabilized power supply apparatus, an ON/OFF circuit is mounted on the DC stabilized power supply apparatus. Also, in order to avoid the chattering phenomenon in an ON/OFF operation, a hysteresis characteristic input circuit is provided as such an ON/OFF circuit.

A prior art CMOS type hysteresis characteristic input circuit is constructed by two p-channel MOS transistors connected in series between a power supply terminal and a connection point, two n-channel MOS transistors connected in series between the connection point and a ground terminal, an inverter connected to the connection point to generate an output voltage, a switching p-channel MOS transistor connected in parallel to one of the above-mentioned two p-channel MOS transistors, and a switching n-channel MOS transistor connected in parallel to one of the above-mentioned two n-channel MOS transistors. The two p-channel MOS transistors and the two n-channel MOS transistors are controlled by an input voltage, while the switching MOS transistors are complementarily controlled by the output voltage (see: JP-10-154924 A). This will be explained later in detail.

SUMMARY OF THE INVENTION

In the above-described prior art CMOS type hysteresis characteristic input circuit, a penetration current can be suppressed to several tens of mA by decreasing the drive abilities of the p-channel MOS transistor connected in parallel to the switching p-channel MOS transistor and the n-channel MOS transistor connected in parallel to the switching n-channel MOS transistor; however, such a penetration current is still large, which would increase the power consumption.

JP-5-327461 A also discloses a similar prior art CMOS type hysteresis characteristic input circuit where diodes are used instead of the MOS transistors connected in parallel to the switching MOS transistors of the above-described prior art CMOS type hysteresis characteristic input circuit.

According to the present invention, in a hysteresis characteristic input circuit, first and second resistors are connected in parallel between a first power supply terminal and a connection point, and first and second MOS transistors are connected in parallel between the connection point and a second power supply terminal and are controlled by an input voltage. An inverter has an input connected to the connection point and an output adapted to generate an output voltage. A first switching element is connected in series to the second resistor, and a second switching element is connected in series to the second MOS transistor. The first and second switching elements are complementarily controlled by the output voltage.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art CMOS type hysteresis characteristic input circuit will be explained with reference to FIGS. 1 and 2 (see: JP-10-154924 A).

Figure 1:
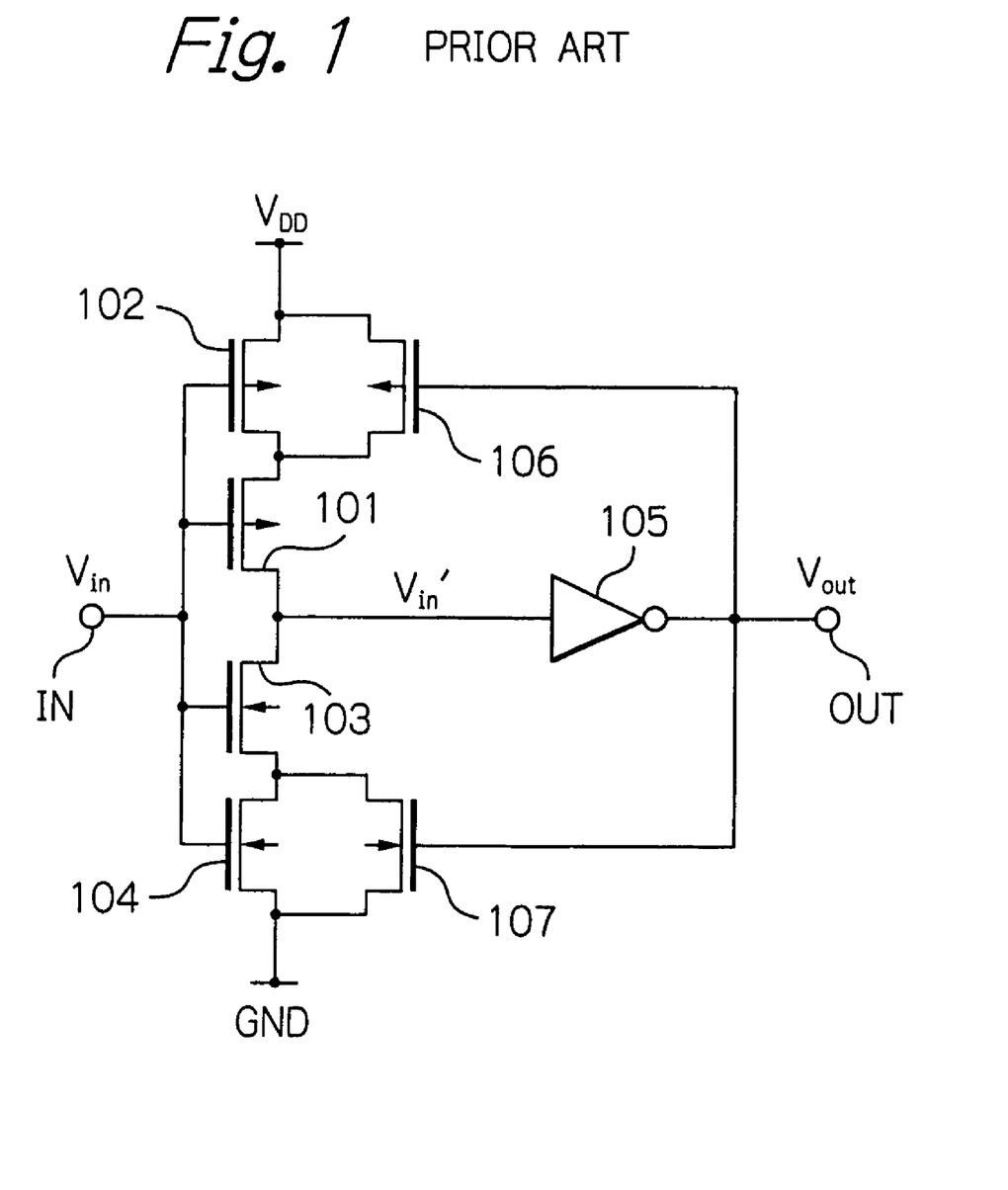
FIG. 1 is a circuit diagram illustrating a prior art CMOS type hysteresis characteristic input circuit.
Figure 2:
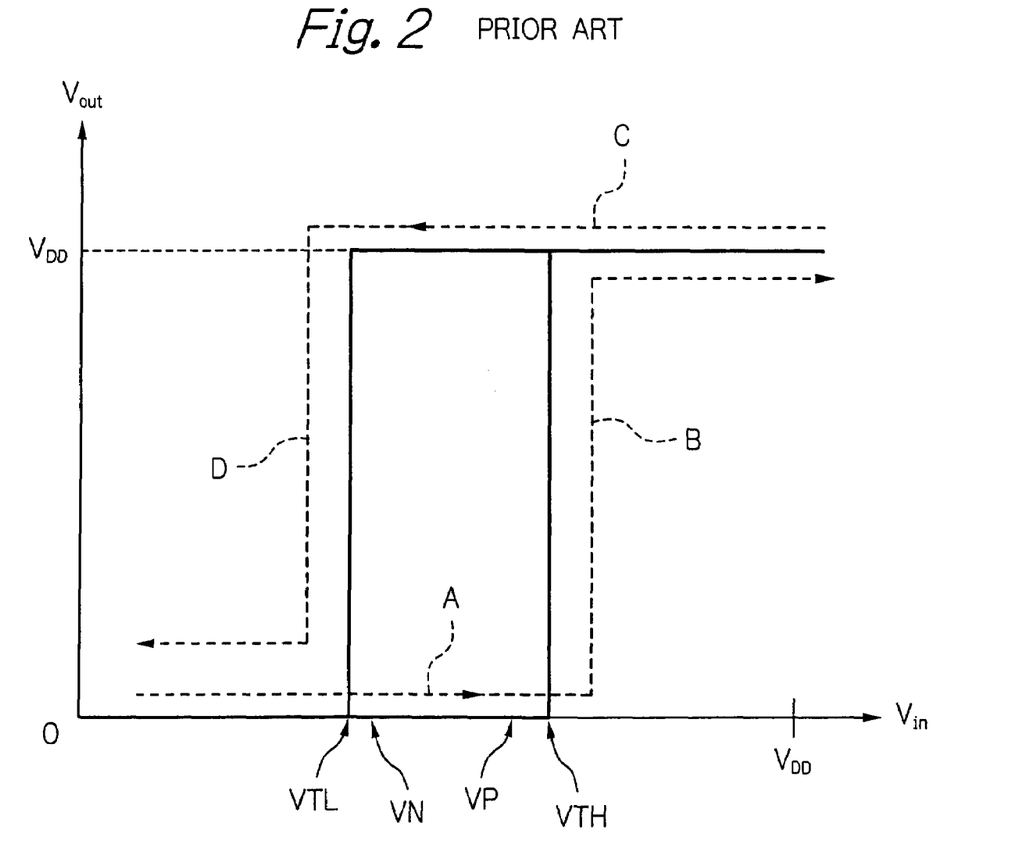
FIG. 2 is a hysteresis curve characteristic diagram for explaining the operation of the CMOS type hysteresis characteristic input circuit of FIG. 1.

In FIG. 1, p-channel MOS transistors 101 and 102 and n-channel MOS transistors 103 and 104 are connected between a power supply terminal $V_{DD}$ whose voltage is 5V, for example, and a ground terminal GND (=0V). Gates of the transistors 101, 102, 103 and 104 are connected commonly to an input terminal IN whose input voltage is defined by $V_{in}$, while a connection point between the transistors 101 and 103 is connected via an inverter 105 to an output terminal OUT whose output voltage is defined by $V_{out}$. Also, a p-channel MOS transistor 106 is connected in parallel with the transistor 102, while an n-channel MOS transistor 107 is connected in parallel with the transistor 104. The gates of the transistors 106 and 107 are controlled by the output voltage $V_{out}$ at the output terminal OUT.

In FIG. 1, the drive ability of the transistor 101 is larger than that of the transistor 102, and the drive ability of the transistor 106 is between those of the transistors 101 and 102. On the other hand, the drive ability of the transistor 103 is larger than that of the transistor 104, and the drive ability of the transistor 107 is between those of the transistors 103 and 104.

The CMOS type hysteresis characteristic input circuit of FIG. 1 has a hysteresis curve characteristic with a low level threshold voltage VTL and a high level threshold voltage VTH (see: FIG. 2). The threshold voltages VTL and VTH can be adjusted by changing the channel width of the transistors 106 and 107. Note that the threshold voltage of the p-channel MOS transistors 101, 102 and 106 is denoted by VP and the threshold voltage of the n-channel MOS transistors 103, 104 and 107 is denoted by VN. Further, the input threshold voltage of the inverter 105 is denoted by VT.

The operation of the CMOS type hysteresis characteristic input circuit of FIG. 1 is explained next with reference to FIG. 2.

First, assume that $V_{in}$=GND (=0V). In this case, the transistors 101 and 102 are turned ON, while the transistors 103 and 104 are turned OFF. Therefore, an input voltage $V_{in}'$ of the inverter 105 is $V_{DD}$, so that the output voltage $V_{out}$ at the output terminal OUT is GND (=0V). As a result, the transistors 106 and 107 are turned ON and OFF, respectively.

Next, as indicated by A, when the input voltage $V_{in}$ at the input terminal IN is increased from GND, the input voltage $V_{in}$ becomes higher than the threshold voltage TN of the transistors 103 and 104 but lower than the threshold voltage VP of the transistors 101 and 102. In this case, the transistors 103 and 104 are turned ON; however, since the input voltage $V_{in}'$ of the inverter 105 is still higher than the input threshold voltage VT, the output voltage $V_{out}$ at the output terminal OUT is GND, so that the transistors 106 and 107 are still turned ON and OFF, respectively. In this state, a penetration current may flow from the power supply terminal $V_{DD}$ through the transistors 102, 101, 103 and 104 to the ground terminal GND; however, since the transistor 104 has a small drive ability while the transistor 107 is turned OFF, this penetration current is small.

Next, as indicated by B, when the input voltage $V_{in}$ at the input terminal IN is further increased, the input voltage $V_{in}$ exceeds the high level threshold voltage VTH of the hysteresis curve characteristic as well as the threshold voltage VP of the p-channel transistors. Therefore, the transistors 101 and 102 are turned OFF to rapidly decrease the input voltage $V_{in}'$ of the inverter 105, thus switching the output of the inverter 105. As a result, the output voltage $V_{out}$ at the output terminal OUT becomes $V_{DD}$, so that the transistors 106 and 107 are turned OFF and ON, respectively.

Next, as indicated by C, when the input voltage $V_{in}$ at the input terminal IN is decreased from $V_{DD}$, the input voltage $V_{in}$ becomes lower than the threshold voltage TP of the transistors 101 and 102 but higher than the threshold voltage VN of the transistors 103 and 104. In this case, the transistors 101 and 102 are turned ON; however, since the input voltage $V_{in}'$ of the inverter 105 is still lower than the input threshold voltage VT, the output voltage $V_{out}$ at the output terminal OUT is $V_{DD}$, so that the transistors 106 and 107 are still turned OFF and ON, respectively. Also, in this state, a penetration current may flow from the power supply terminal $V_{DD}$ through the transistors 102, 101, 103 and 104 to the ground terminal GND; however, since the transistor 102 has a small drive ability while the transistor 106 is turned OFF, this penetration current is small.

Next, as indicated by D, when the input voltage $V_{in}$ at the input terminal IN is further decreased, the input voltage $V_{in}$ becomes lower than the low level threshold voltage VTL of the hysteresis curve characteristic as well as the threshold voltage VN of the n-channel transistors. Therefore, the transistors 103 and 104 are turned OFF to rapidly increase the input voltage $V_{in}'$ of the inverter 105, thus switching the output of the inverter 105. As a result, the output voltage $V_{out}$ at the output terminal OUT becomes GND, so that the transistors 106 and 107 are turned ON and OFF, respectively.

Thus, in FIG. 1, even when the input voltage $V_{in}$ at the input terminal IN is at an intermediate level between VN and VP, a penetration current may flow; however, this penetration current can be suppressed to several tens of mA, for example, by the small drive ability of the transistors 102 or 104. However, if the input voltage $V_{in}$ at the input terminal IN remains at such an intermediate level for a relatively long time, the penetration current cannot be neglected, which would increase the power consumption.

Figure 3:
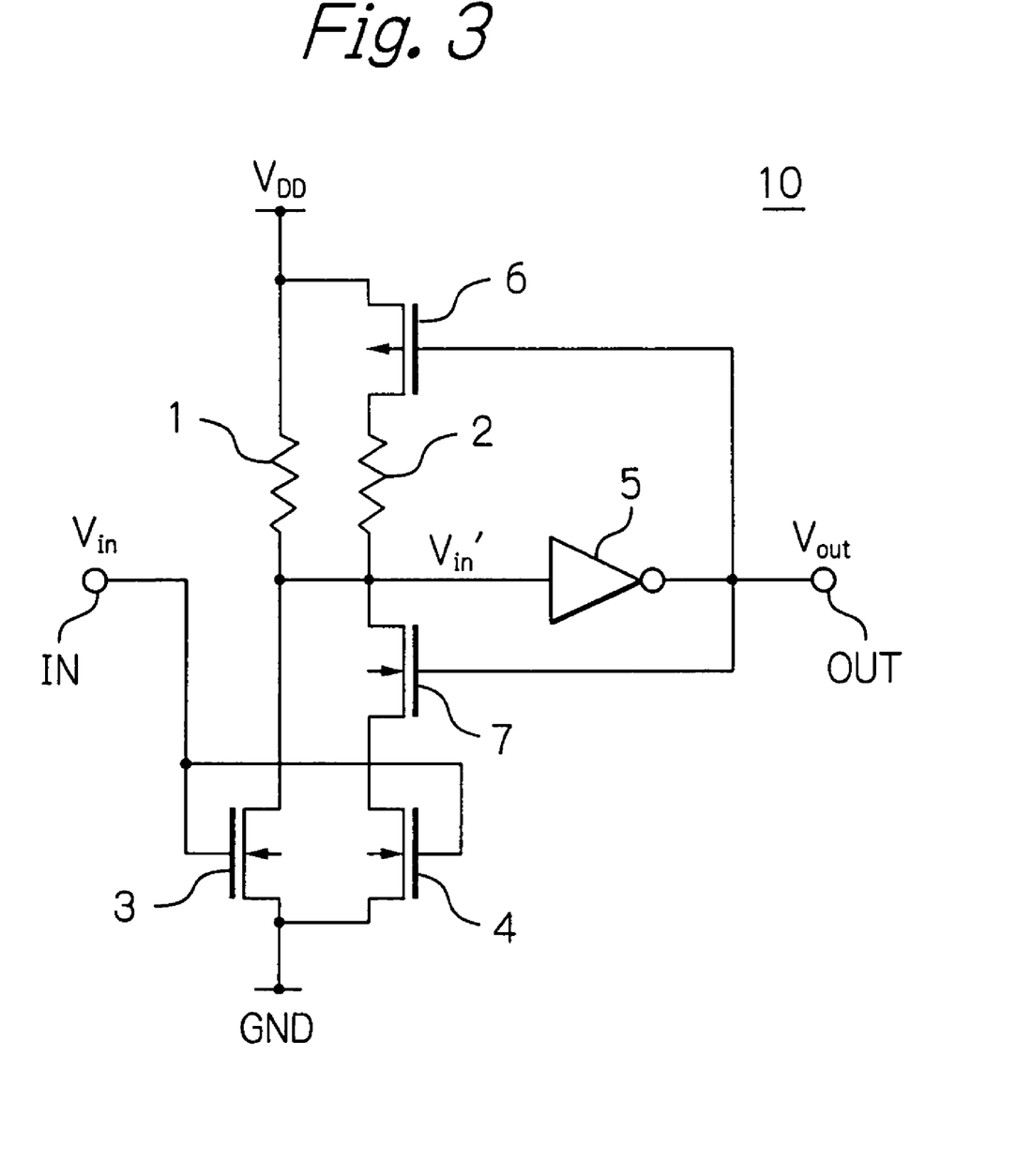
FIG. 3 is a circuit diagram illustrating a first embodiment of the CMOS type hysteresis characteristic input circuit according to the present invention.

In FIG. 3, which illustrates a first embodiment of the CMOS type hysteresis characteristic input circuit according to the present invention, a CMOS type hysteresis characteristic input circuit 10 is constructed by resistors 1 and 2 connected in parallel and n-channel MOS transistors 3 and 4 connected in parallel are connected in series between a power supply terminal $V_{DD}$ whose voltage is 5V, for example, and a ground terminal GND (=0V). Gates of the transistors 3 and 4 are connected commonly to an input terminal IN whose input voltage is denoted by $V_{in}$. A connection point between the resistors 1 and 2 and the transistors 3 and 4 is connected via an inverter 5 to an output terminal OUT whose output voltage is denoted by $V_{out}$. Also, a p-channel MOS transistor 6 is connected in series to the resistor 2, while an n-channel MOS transistor 7 is connected in series to the transistor 4. The gates of the transistors 6 and 7 are controlled by the output voltage $V_{out}$ at the output terminal OUT.

The resistors 1 and 2 have very large resistance values of several MΩ, for example.

Figure 4:
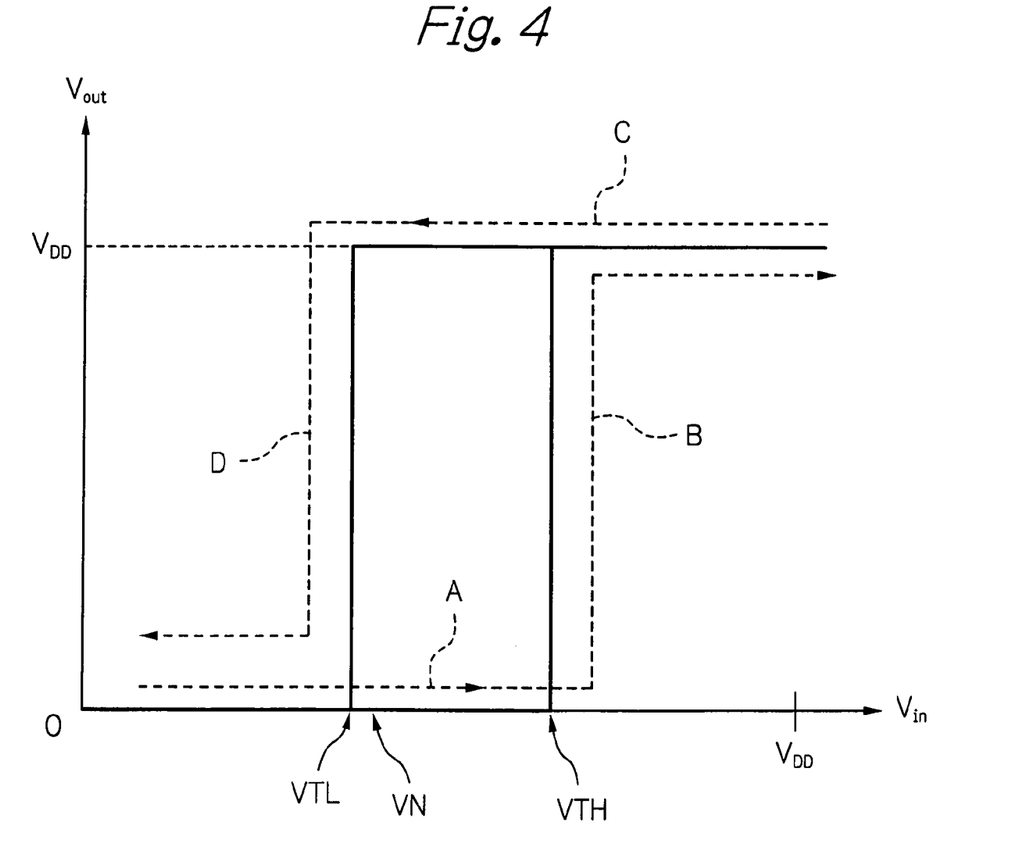
FIG. 4 is a hysteresis curve characteristic diagram for explaining the operation of the CMOS type hysteresis characteristic input circuit of FIG. 3.

The CMOS type hysteresis characteristic input circuit 10 has a hysteresis curve characteristic with a low level threshold voltage VTL and a high level threshold voltage VTH (see: FIG. 4). The threshold voltages VTL and VTH can be adjusted by changing the channel width of the transistors 6 and 7. Note that the threshold voltage of the n-channel MOS transistors 3 and 4 is denoted by VN. Further, the input threshold voltage of the inverter 5 is denoted by VT.

The operation of the CMOS type hysteresis characteristic input circuit 10 is explained next with reference to FIG. 4.

First, assume that $V_{in}$=GND (=0V). In this case, the transistors 3 and 4 are turned OFF. Therefore, an input voltage $V_{in}'$ of the inverter 5 is $V_{DD}$, so that the output voltage $V_{out}$ at the output terminal OUT is GND (=0V). As a result, the transistors 6 and 7 are turned ON and OFF, respectively. In this state, since the transistors 3, 4 and 7 are turned OFF, no penetration current flows from the power supply terminal $V_{DD}$ to the ground terminal GND. Also, the combined resistance value of the resistors 1 and 2 is 2.5 MΩ (=5 MΩ/2).

Next, as indicated by A, when the input voltage $V_{in}$ at the input terminal IN is increased from GND, the input voltage $V_{in}$ becomes higher than the threshold voltage TN of the transistors 3 and 4. In this case, the transistors 3 and 4 are turned ON; however, since the input voltage $V_{in}'$ of the inverter 5 is still higher than the input threshold voltage VT, the output voltage $V_{out}$ at the output terminal OUT is GND, so that the transistors 6 and 7 are still turned ON and OFF, respectively. In this state, a penetration current may flow from the power supply terminal $V_{DD}$ through the resistors 1 and 2 combined by the transistor 6, and the transistor 3 to the ground terminal GND; however, since the combined resistance value of the resistors 1 and 2 has a large resistance such as 2.5 MΩ (=5 MΩ/2), this penetration current is small, i.e., less than 2 μA.

Next, as indicated by B, when the input voltage $V_{in}$ at the input terminal IN is further increased, the input voltage $V_{in}$ reaches the high level threshold voltage VTH of the hysteresis curve characteristic. That is, the input voltage $V_{in}'$ of the inverter 15 reaches the input threshold voltage VT which is represented by $$VT = V_{DD} \cdot RTH / \{(R/2) + RTH\} \qquad (1)$$

where R is a resistance value of each of the resistors 1 and 2; and

RTH is a drain-to-source resistance value of each of the transistors 3 and 4. Therefore, the input voltage $V_{in}'$ of the inverter 5 is increased, thus switching the output of the inverter 5. As a result, the output voltage $V_{out}$ at the output terminal OUT becomes $V_{DD}$, so that the transistors 6 and 7 are turned OFF and ON, respectively. In this state, a penetration current may flow from the power supply terminal $V_{DD}$ through the resistor 1, the transistors 3, 4 and 7 to the ground terminal GND; however, since the resistor 1 has a large resistance value of 5 MΩ, this penetration current is small, i.e., less than 1 μA.

Next, as indicated by C, the input voltage $V_{in}$ at the input terminal IN is decreased from $V_{DD}$. However, since the input voltage $V_{in}'$ of the inverter 5 is still higher than the input threshold voltage VT, the output voltage $V_{out}$ at the output terminal OUT is GND, so that the transistors 6 and 7 are still turned OFF and ON, respectively. In this state, a penetration current may flow from the power supply terminal $V_{DD}$ through the resistor 1 and the transistors 3, 4 and 7 to the ground terminal GND; however, since the resistance value of the resistor 1 has a large resistance such as 5 MΩ, this penetration current is small, i.e., less than 1 μA.

Finally, as indicated by D, when the input voltage $V_{in}$ at the input terminal IN is further decreased, the input voltage $V_{in}$ reaches the low level threshold voltage VTL of the hysteresis curve characteristic. That is, the input voltage $V_{in}'$ of the inverter 5 reaches the input threshold voltage VT which is represented by $$VT = V_{DD} \cdot (RTL/2) / \{(R/2) + (RTL/2)\} \quad (2)$$

where RTL is a drain-to-source resistance value of each of the transistors 3 and 4. Therefore, the input voltage $V_{in}'$ of the inverter 5 is increased, thus switching the output of the inverter 5. As a result, the output voltage $V_{out}$ at the output terminal OUT becomes GND, so that the transistors 6 and 7 are turned ON and OFF, respectively. In this state, since the transistors 3, 4 and 7 are turned OFF, no penetration current may flow from the power supply terminal $V_{DD}$ to the ground terminal GND.

From equations (1) and (2), $$RTH/\{(R/2) + RTH\} = (RTL/2)/\{R + (RTL/2)\} \quad (3)$$

Therefore, $$RTL/RTH = 4 \quad (4)$$

$$\therefore VTL < VTH \quad (5)$$

Thus, a hysteresis curve characteristic is realized.

Figure 5:
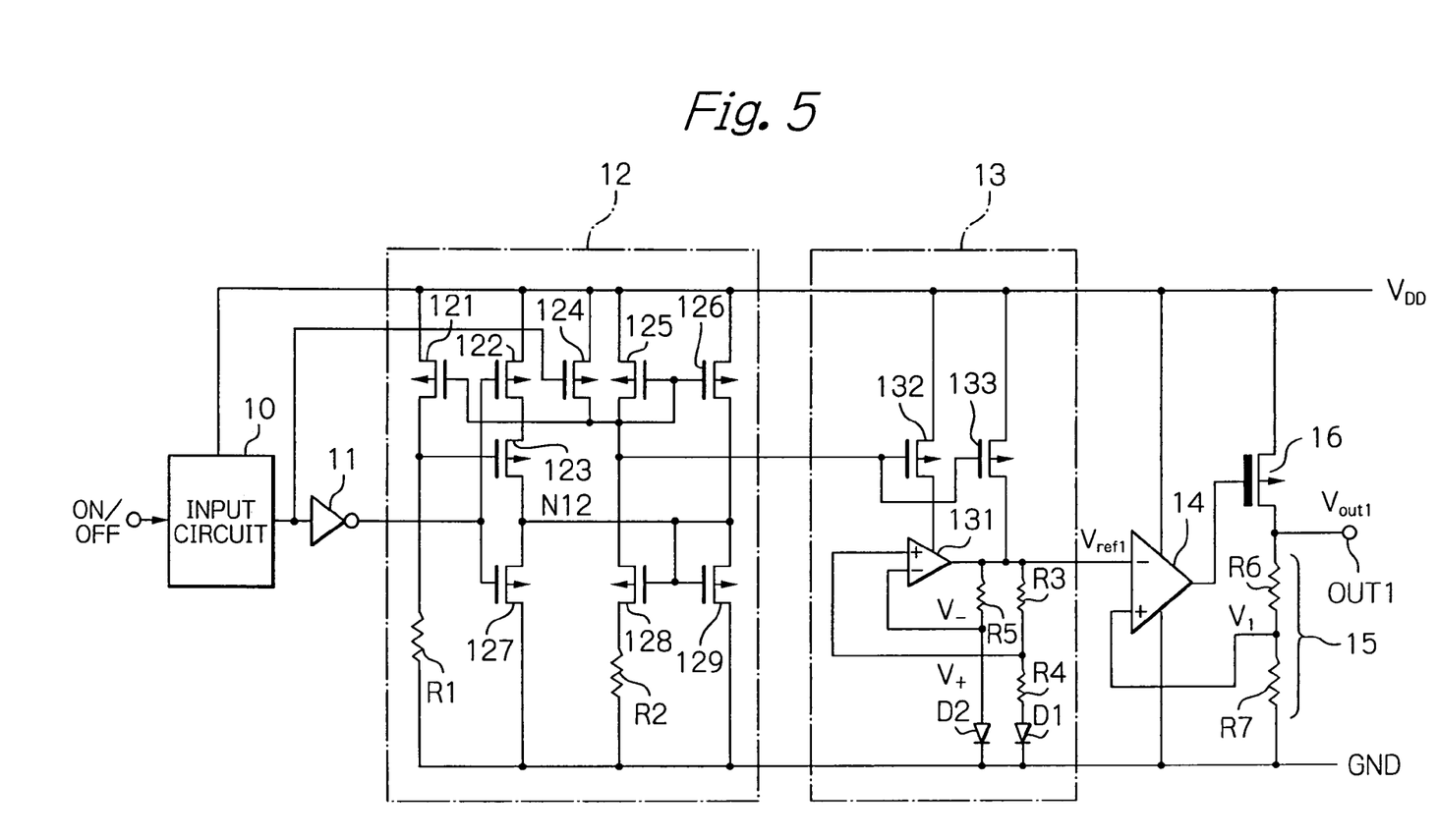
FIG. 5 is a circuit diagram illustrating a DC stabilized power supply apparatus to which the CMOS type hysteresis characteristic input circuit of FIG. 3 is applied.

The CMOS type hysteresis characteristic input circuit 10 can be applied to a DC stabilized power supply apparatus as illustrated in FIG. 5.

In FIG. 5, the DC stabilized power supply apparatus is constructed by an ON/OFF circuit formed by the CMOS type hysteresis characteristic input circuit 10 of FIG. 3 to which an ON/OFF signal is supplied, an inverter 11, a starting circuit 12, a reference voltage generating circuit 13 operated by the starting circuit 12 to generate a reference voltage $V_{ref1}$, a differential amplifier 14 for amplifying the difference between the reference voltage $V_{ref1}$ and a voltage $V_1$ derived from a voltage divider 15 formed by two resistors connected in series to control a p-channel MOS transistor 16. The voltage divider 15 is connected between an output terminal OUT1 and a ground terminal GND, while the p-channel MOS transistor 16 is connected between a power supply terminal $V_{DD}$ and the output terminal OUT1.

The starting circuit 12 is constructed by p-channel MOS transistors 121 to 126, n-channel MOS transistors 127 to 129 and resistors R1 and R2. In this case, the transistors 125 and 126 form a current mirror circuit, and the transistors 128 and 129 form another current mirror circuit.

The reference voltage generating circuit 13 is constructed by a differential amplifier 131 which has a positive side input to which a voltage V, depending upon the reference voltage $V_{ref1}$ is applied by a feedback circuit formed by resistors R3 and R4 and a diode D1 and a negative-side input to which a voltage V depending upon the reference voltage $V_{ref1}$ is applied by a feedback circuit formed by a resistor R5 and a diode D2. Also, the reference voltage generating circuit 13 includes p-channel MOS transistors 132 and 133 adapted to receive the output voltage of the starting circuit 12 to activate the differential amplifier 131 and pull up the reference voltage $V_{ref1}$.

The operation of the DC stabilized power supply apparatus of FIG. 5 is explained below.

First, when the ON/OFF signal is increased to $V_{DD}/2$, the output voltage of the input circuit 10 is high (=$V_{DD}$) to turn OFF the transistor 124, and the output voltage of the inverter 11 is low (=GND) to turn ON the transistor 122 and turn OFF the transistor 127. In this case, since the transistor 123 is in an ON state by the resistor R1, the voltage at a node N12 is increased to turn ON the transistors 128 and 129. Thus, the output voltage of the starting circuit 12 is decreased, to turn ON the transistors 121, 125 and 126. Simultaneously, the transistors 132 and 133 are turned ON by the low output voltage of the starting circuit 12 to activate the reference voltage generating circuit 13. As a result, the difference between the divided voltage $V_1$ of the voltage divider 15 and the reference voltage $V_{ref1}$ is amplified by the differential amplifier 14 to obtain a stabilized DC output voltage $V_{out1}$ at the output terminal OUT1.

Next, when the ON/OFF signal is decreased to GND, the output voltage of the input circuit 10 is low (=GND) to turn ON the transistor 124, and the output voltage of the inverter 11 is high (=$V_{DD}$) to turn OFF the transistor 122 and turn ON the transistor 127. In this case, since the transistor 123 is in an ON state by the resistor R1, the voltage at the node N12 is decreased to turn OFF the transistors 128 and 129. Thus, the output voltage of the starting circuit 12 is increased, to turn OFF the transistors 121, 125 and 126. Simultaneously, the transistors 132 and 133 are turned OFF by the high output voltage of the starting circuit 12 to deactivate the reference voltage generating circuit 13. As a result, the DC output voltage $V_{out1}$ at the output terminal OUT1 becomes low (=GND).

In FIG. 5, when the ON/OFF signal is at an intermediate level, the penetration current flowing through the input circuit 10 can be decreased, thus decreasing the power consumption.

Figure 6:
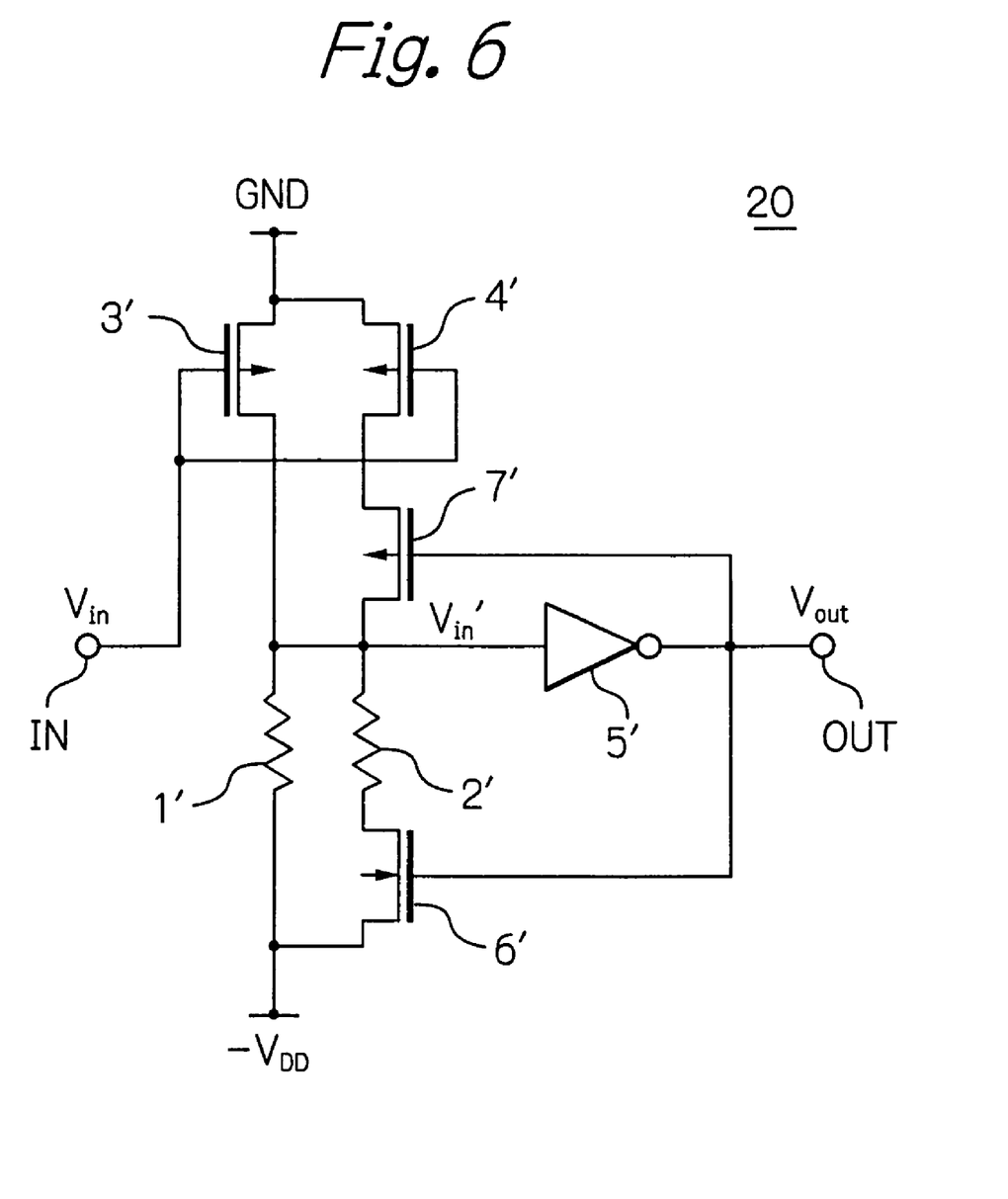
FIG. 6 is a circuit diagram illustrating a second embodiment of the CMOS type hysteresis characteristic input circuit according to the present invention.

In FIG. 6, which illustrates a second embodiment of the CMOS type hysteresis characteristic input circuit according to the present invention, a CMOS type hysteresis characteristic input circuit 20 is constructed between a ground terminal GND and a negative power supply terminal ($-V_{DD}$). Also, resistors 1' and 2' corresponding to the resistors 1 and 2, respectively, of FIG. 3 are provided. Further, p-channel MOS transistors 3' and 4' corresponding to the n-channel MOS transistors 3 and 4, respectively, of FIG. 3, an inverter 5' corresponding to the inverter 5 of FIG. 3, and an n-channel MOS transistor 6' and a p-channel MOS transistor 7' corresponding to the p-channel MOS transistor 6 and the n-channel MOS transistor 7, respectively, of FIG. 3 are provided.

Figure 7:
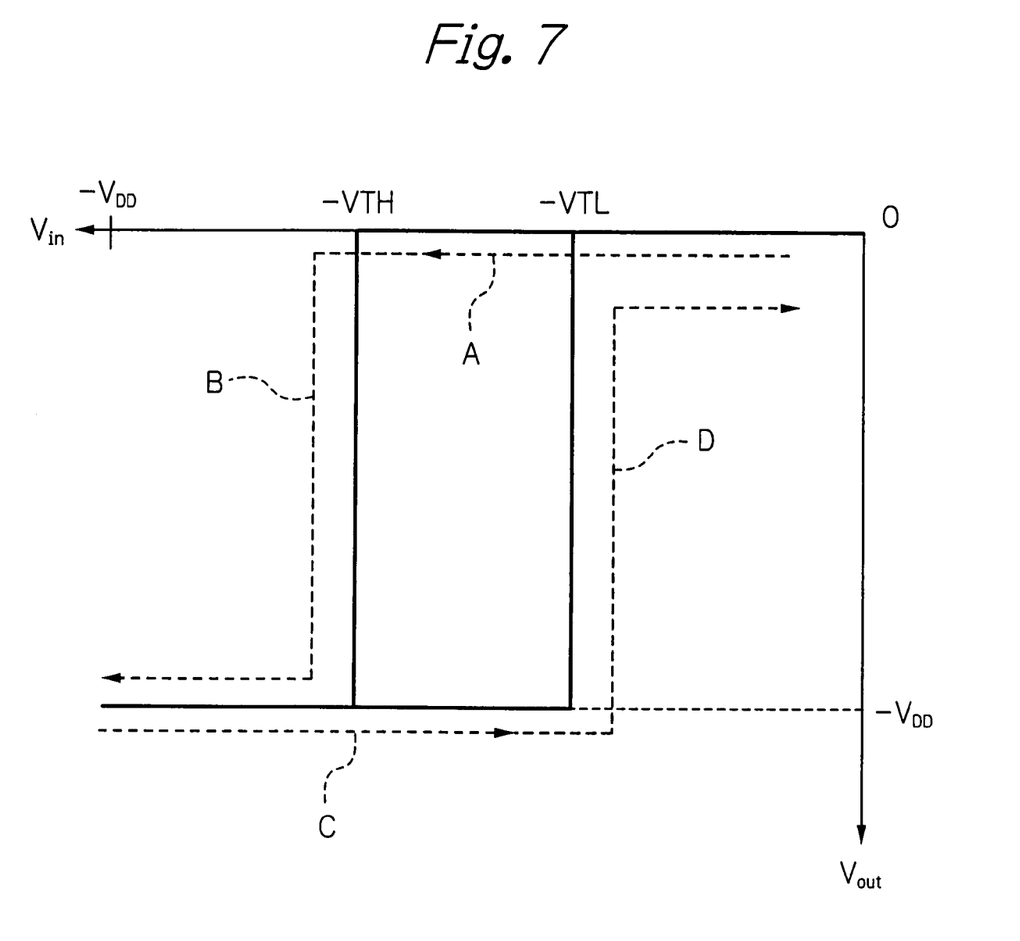
FIG. 7 is a hysteresis curve characteristic diagram for explaining the operation of the CMOS type hysteresis characteristic input circuit of FIG. 6.

The operation of the CMOS type hysteresis characteristic input circuit 20 is explained with reference to FIG. 7 which is similar to FIG. 4. That is, in the operation as shown in FIG. 4, the input voltage $V_{in}$ changes from GND to the positive side. On the other hand, in the operation as shown in FIG. 7, the input voltage $V_{in}$ changes from GND to the negative side.

Figure 8:
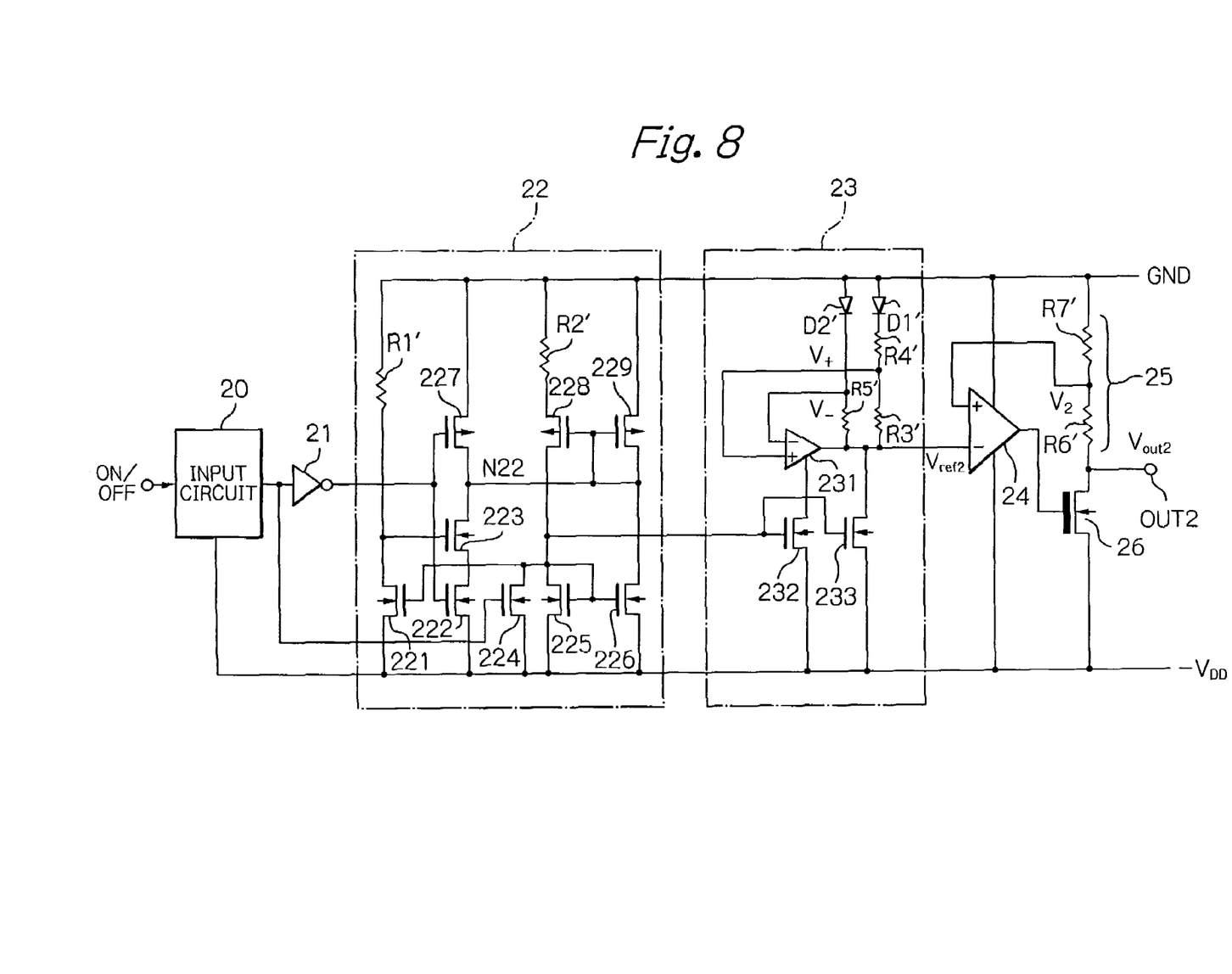
FIG. 8 is a circuit diagram illustrating a DC stabilized power supply apparatus to which the CMOS type hysteresis characteristic input circuit of FIG. 6 is applied.

The CMOS type hysteresis characteristic input circuit 20 can be applied to a stabilized power supply apparatus as illustrated in FIG. 8.

In FIG. 8, the DC stabilized power supply apparatus is constructed by an ON/OFF circuit formed by the CMOS type hysteresis characteristic input circuit 20 of FIG. 6 to which an ON/OFF signal is supplied, an inverter 21, a starting circuit 22, a reference voltage generating circuit 23 operated by the starting circuit 22 to generate a reference voltage $V_{ref2}$, a differential amplifier 24 for amplifying the difference between the reference voltage $V_{ref2}$ and a voltage $V_2$ derived from a voltage divider 25 formed by two resistors connected in series to control an n-channel MOS transistor 26. The voltage divider 25 is connected between a ground terminal GND and an output terminal OUT2, while the n-channel depletion type transistor 26 is connected between the output terminal OUT2 and a power supply terminal $-V_{DD}$.

The starting circuit 22 is constructed by n-channel MOS transistors 221 to 226, p-channel MOS transistors 227 to 229 and resistors R1' and R2'. In this case, the transistors 225 and 226 form a current mirror circuit, and the transistors 228 and 229 form another current mirror circuit.

The reference voltage generating circuit 23 is constructed by a differential amplifier 231 which has a positive side input to which a voltage $V_+$ depending upon the reference voltage $V_{ref2}$ is applied by a feedback circuit formed by resistors R3' and R4' and a diode D1' and a negative-side input to which a voltage V depending upon the reference voltage $V_{ref2}$ is applied by a feedback circuit formed by a resistor R5' and a diode D2'. Also, the reference voltage generating circuit 23 includes n-channel MOS transistors 232 and 233 adapted to receive the output voltage of the starting circuit 22 to activate the differential amplifier 231 and pull down the reference voltage $V_{ref2}$.

The operation of the DC stabilized power supply apparatus of FIG. 5 is explained below.

First, when the ON/OFF signal is decreased to $-V_{DD}$, the output voltage of the input circuit 20 is low ($=-V_{DD}$) to turn OFF the transistor 224, and the output voltage of the inverter 21 is high (=GND) to turn ON the transistor 222 and turn OFF the transistor 227. In this case, since the transistor 223 is in an ON state by the resistor R1', the voltage at a node N22 is decreased to turn ON the transistors 228 and 229. Thus, the output voltage of the starting circuit 22 is increased, to turn ON the transistors 221, 225 and 226. Simultaneously, the transistors 232 and 233 are turned ON by the high output voltage of the starting circuit 22 to activate the reference voltage generating circuit 23. As a result, the difference between the divided voltage $V_2$ of the voltage divider 25 and the reference voltage $V_{ref2}$ is amplified by the differential amplifier 24 to obtain a stabilized DC output voltage $V_{out2}$ at the output terminal OUT2.

Next, when the ON/OFF signal is increased to GND, the output voltage of the input circuit 20 is high (=GND) to turn ON the transistor 224, and the output voltage of the inverter 21 is low ($=-V_{DD}$) to turn OFF the transistor 222 and turn ON the transistor 227. In this case, since the transistor 223 is in an ON state by the resistor R1', the voltage at the node N22 is increased to turn OFF the transistors 228 and 229. Thus, the output voltage of the starting circuit 22 is decreased, to turn OFF the transistors 221, 225 and 226. Simultaneously, the transistors 232 and 233 are turned OFF by the low output voltage of the starting circuit 22 to deactivate the reference voltage generating circuit 23. As a result, the DC output voltage $V_{out2}$ at the output terminal OUT2 becomes high (=GND).

Also, in FIG. 8, when the ON/OFF signal is at an intermediate level, the penetration current flowing through the input circuit 20 can be decreased, thus decreasing the power consumption.

The invention claimed is:

1. A hysteresis characteristic input circuit, comprising:
   first and second power supply terminals;
   first and second resistors connected in parallel between said first power supply terminal and a connection point;
   first and second MOS transistors connected in parallel between said connection point and said second power supply terminal, said first and second MOS transistors being controlled by an input voltage;
   an inverter having an input connected to said connection point and an output adapted to generate an output voltage;
   a first switching element connected in series between said second resistor and said first power supply terminal; and
   a second switching element connected in series between said second MOS transistor and said connection point,
   wherein said first and second switching elements are complementarily controlled by said output voltage.

2. The hysteresis characteristic input circuit as set forth in claim 1, wherein a voltage at said first power supply terminal is higher than a voltage at said second power supply terminal,
   wherein said first and second MOS transistors each comprises an n-type conductivity type transistor,
   wherein said first switching element comprises a p-channel MOS transistor, and
   wherein said second switching element comprises an n-channel MOS transistor.

3. The hysteresis characteristic input circuit as set forth in claim 1, wherein a voltage at said first power supply terminal is lower than a voltage at said second power supply terminal,
   wherein said first and second MOS transistors comprise a p-type conductivity type transistor,
   wherein said first switching element comprises an n-channel MOS transistor, and
   wherein said second switching element comprises a p-channel MOS transistor.

4. An ON/OFF circuit for a DC stabilized power supply apparatus comprising the hysteresis characteristic input circuit as set forth in claim 1.

5. The ON/OFF circuit for a DC stabilized power supply apparatus as set forth in claim 4, wherein said DC stabilized power supply apparatus is adapted to generate a stabilized positive voltage.

6. The ON/OFF circuit for a DC stabilized power supply apparatus as set forth in claim 4, wherein said DC stabilized power supply apparatus is adapted to generate a stabilized negative voltage.

7. The hysteresis characteristic input circuit as set forth in claim 1, wherein a resistance value of the first and second resistors is 5 MΩ or greater.

8. The hysteresis characteristic input circuit as set forth in claim 1, wherein, when the second power supply is low, the first switching element is turned ON and the second switching element and the first and second MOS transistors are turned OFF.

9. Tim hysteresis characteristic input circuit as set forth in claim 1, wherein, when the second power supply is higher than a threshold voltage of the first and second MOS transistors, the first switching element and the first and second MOS transistors are turned ON and the second switching element is turned OFF.

10. The hysteresis characteristic input circuit as set forth in claim 1, wherein, when the second power supply reaches a high level threshold voltage, an output of the inverter is switched.

11. The hysteresis characteristic input circuit as set forth in claim 10, wherein, when the output of the Inverter is switched, the first switching element is turned OFF and the second switching element is turned ON.

12. The hysteresis characteristic input circuit as set forth in claim 10, wherein, when the output of the inverter Is switched, a penetration current flows through the first resistor.

13. The hysteresis characteristic input circuit as set forth in claim 9, wherein, when the output of the inverter is switched, a penetration current flows through the first resistor and the second resistor.

* * * * *